US009583565B2

(12) United States Patent
Poelzl

(10) Patent No.: US 9,583,565 B2
(45) Date of Patent: Feb. 28, 2017

(54) SEMICONDUCTOR DEVICE WITH ISOLATING LAYER ON SIDE AND BOTTOM SURFACES

(71) Applicant: Infineon Technologies Austria AG, Villach (AT)

(72) Inventor: Martin Poelzl, Ossiach (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/731,970

(22) Filed: Jun. 5, 2015

(65) Prior Publication Data

US 2015/0357408 A1    Dec. 10, 2015

(30) Foreign Application Priority Data

Jun. 5, 2014   (DE) .................. 10 2014 107 994

(51) Int. Cl.
| | | |
|---|---|---|
| H01L 29/06 | (2006.01) | |
| H01L 21/762 | (2006.01) | |
| H01L 21/02 | (2006.01) | |
| H01L 21/311 | (2006.01) | |
| H01L 21/3105 | (2006.01) | |

(52) U.S. Cl.
CPC .... H01L 29/0649 (2013.01); H01L 21/02233 (2013.01); H01L 21/31051 (2013.01); H01L 21/31144 (2013.01); H01L 21/762 (2013.01); H01L 21/76264 (2013.01); H01L 29/0684 (2013.01); H01L 29/0692 (2013.01)

(58) Field of Classification Search
CPC ............ H01L 29/0684; H01L 29/0649; H01L 29/7846; H01L 21/02233; H01L 21/762; H01L 21/823878
See application file for complete search history.

(56) References Cited

U.S. PATENT DOCUMENTS

| | | | | |
|---|---|---|---|---|
| 2002/0182822 A1* | 12/2002 | Mandelman | ...... | H01L 21/28247 438/406 |
| 2004/0038466 A1* | 2/2004 | Yen | .................. | H01L 21/28194 438/197 |
| 2004/0135178 A1* | 7/2004 | Onose | ................. | H01L 29/1066 257/262 |
| 2004/0227208 A1* | 11/2004 | Lee | ................... | H01L 21/76224 257/510 |
| 2005/0167742 A1* | 8/2005 | Challa | ................. | H01L 21/3065 257/328 |

(Continued)

FOREIGN PATENT DOCUMENTS

DE         102011004476 A1    8/2011

*Primary Examiner* — Dale E Page
*Assistant Examiner* — John Bodnar
(74) *Attorney, Agent, or Firm* — Murphy, Bilak & Homiller, PLLC

(57) ABSTRACT

A method for manufacturing a semiconductor device comprises includes providing a substrate with a surface, forming an isolating layer on part of the surface, and forming a first semiconductor portion and spaced therefrom a second semiconductor portion on the surface of the substrate. The isolating layer is interposed between a side surface of the first semiconductor portion and a side surface of the second semiconductor portion which face each other. The method further includes forming a first side isolation layer on the side surface of the first semiconductor portion.

10 Claims, 12 Drawing Sheets

(56) References Cited

U.S. PATENT DOCUMENTS

2011/0204485 A1    8/2011  Momota et al.
2015/0162438 A1\*  6/2015  Chou ................ H01L 29/7851
                                                            257/321

\* cited by examiner

SEMICONDUCTOR DEVICE WITH ISOLATING LAYER ON SIDE AND BOTTOM SURFACES

PRIORITY CLAIM

This application claims priority to German Patent Application No. 10 2014 107 994.9 filed on 5 Jun. 2014, the content of said application incorporated herein by reference in its entirety.

TECHNICAL FIELD

The present disclosure relates to isolation schemes for semiconductor devices and in particular to a method for manufacturing a semiconductor device and a semiconductor device.

BACKGROUND

In the field of, for example, voltage conversion in the DC/DC computing market, the demands are constantly growing with respect to power switches. Until now, drivers and controller chips used, for example, in buck converters typically include discrete field-effect transistors (FET). However, also in high-current applications (as for example for currents comprising 5-100 A/phase or between 20-40 A/phase) the integration is constantly increasing. Apart from additional features such as current sense or temperature sense, logic circuitry or whole output stages of gate drivers may be integrated in power stages of field-effect transistors.

Therefore, there is a demand in silicon technology to provide at low cost a high integration while ensuring a secure isolation maintaining the reliability of the circuitry.

SUMMARY

A method for manufacturing a semiconductor device is disclosed. According to an embodiment, the method includes providing a substrate with a surface; forming an isolating layer on part of the surface, forming a first semiconductor portion and, spaced therefrom, a second semiconductor portion on the surface of the substrate. The isolating layer is interposed between a side surface of the first semiconductor portion and a side surface of the second semiconductor portion which face each other. The method further includes forming a first side isolation layer on the side surface of the first semiconductor portion.

According to another embodiment, the method includes providing a non-planar substrate with a protrusion, forming an isolation layer such that the isolation layer covers at least partially the protrusion, and forming a first semiconductor portion and a second semiconductor portion such that the protrusion is between the first semiconductor portion and the second semiconductor portion.

A semiconductor device is disclosed. According to an embodiment, the semiconductor device includes an intermediate structure, a first semiconductor portion with a side surface, a second semiconductor portion, and a first side isolation layer on the side surface of the first semiconductor portion. The first semiconductor portion and the second semiconductor portion are spaced from each other and the intermediate structure is interposed between the side surface of the first semiconductor portion and a facing side surface of the second semiconductor portion. The first semiconductor portion laterally overlaps a first intermediate isolation layer and the second semiconductor portion laterally overlaps a second intermediate isolation layer.

BRIEF DESCRIPTION OF THE DRAWINGS

Some examples of the devices and/or methods will be described in the following by way of examples only, and with reference to the accompanying Figures, in which.

DETAILED DESCRIPTION

Various examples will now be described in more detail with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, may be interpreted as having a meaning that is consistent with their meaning in the context of the relevant art and will not be interpreted in an idealized or overly formal sense unless expressly so defined herein.

Figure 1A:
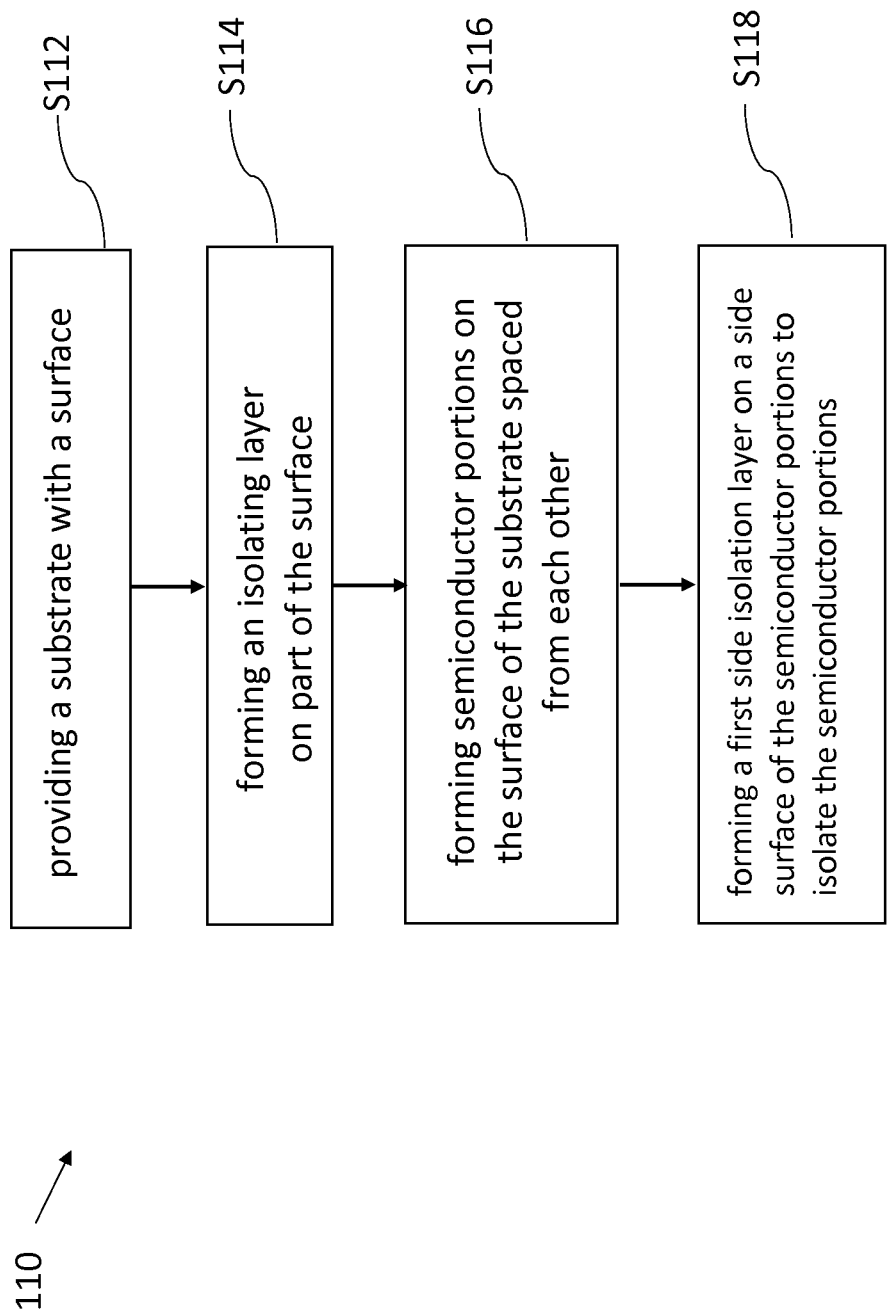
FIG. 1A depicts a flow diagram of a method for manufacturing a semiconductor device, according to an embodiment.

FIG. 1A depicts a method 110 for manufacturing a semiconductor device 500 (see also FIG. 2) according to an example of the present disclosure. The method 110 includes: providing S112 a substrate 210 with a surface 211; forming S114 an isolating layer 220 on part of the surface 211; forming S116 a first semiconductor portion 231 and spaced therefrom a second semiconductor portion 232 on the surface 211 of the substrate 210, wherein the isolating layer 220 is interposed between a side surface 233a of the first semiconductor portion 231 and a side surface 234a of the second semiconductor portion 232 which face each other; and forming S118 a first side isolation layer 241a on the side surface 233a of the first semiconductor portion 231.

A semiconductor device 500 may be implemented by any semiconductor processing technology capable of forming the mentioned structures, for example. In other words, the semiconductor substrate of the semiconductor device 500 may be a silicon-based semiconductor substrate, a silicon carbide-based semiconductor substrate, a gallium arsenide-based semiconductor substrate or a gallium nitride-based semiconductor substrate, for example. The semiconductor substrate may be an SOI substrate (silicon on insulator), an SON (silicon on nothing) substrate or may be implemented by an epitaxial layer, for example.

A main surface or front side surface of the semiconductor substrate may be a semiconductor surface of the semiconductor substrate towards metal layers, insulation layers and/or passivation layers on top of the semiconductor surface. In comparison to a basically vertical edge (e.g., resulting from separating the semiconductor substrate from others) of the semiconductor substrate, the main surface of the semiconductor substrate may be a basically horizontal surface extending laterally. The main surface of the semiconductor substrate may be a basically even plane (e.g., neglecting unevenness of the semiconductor structure due to the manufacturing process or trenches). In other words, the main surface of the semiconductor substrate may be the interface between the semiconductor material and an insulation layer, metal layer or passivation layer on top of the semiconductor substrate.

An insulating layer may be defined as a layer formed of any electrically insulating material, i.e., a layer that prevents a formation of electric paths. The side surface may be defined as a surface, e.g., being perpendicular to a main surface or extends along formation direction of the manufacturing process of the semiconductor device 500.

By implementing two isolating layers, one of which is along the side surface of the first semiconductor portion, may provide an improved isolation. In particular if both isolation layers are formed in subsequent steps may improve the isolation at corner regions.

In this example the semiconductor portion that comprises the side isolating layer 241a is named first semiconductor portion 231. However, according to further example, the first and second semiconductor portions 231, 232 may be interchanged, i.e., the side isolating side may be formed on the second semiconductor portions 232. In addition, in further examples not only two semiconductor portions 231, 232 are formed with the method 110, but a plurality of semiconductor portions including the first and second semiconductor portions 231, 232 are formed and securely isolation from each other.

The first side isolation layer 241a on the side surface 233a of the first semiconductor portion 231 may be implemented such that the first semiconductor portion 231 is laterally isolated from the second semiconductor portion 232. However, there may be still an electrical path between the first semiconductor portion 231 and the second semiconductor portion 232 through the substrate and/or a common source or gate wiring or electrode.

Moreover, according to another example, the method 110 may further include forming a second side isolation layer 242a on the side surface 234a of the second semiconductor portion 232.

Figure 1B:
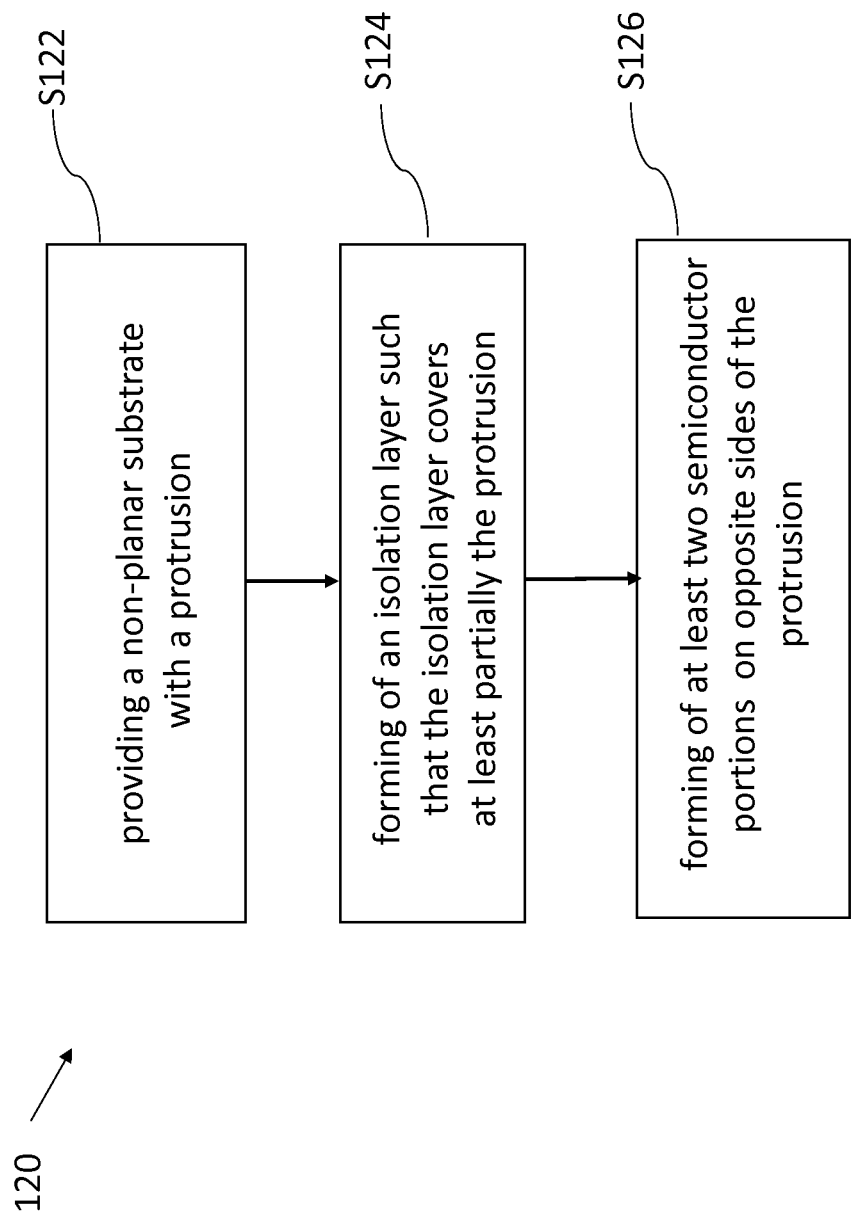
FIG. 1B depicts a flow diagram of a further method for manufacturing a further semiconductor device, according to another embodiment.

FIG. 1B depicts a further method 120 for manufacturing a semiconductor device 500 (see also FIG. 6) according to another example of the present disclosure. The further method 120 includes: providing S122 a non-planar substrate 214 with a protrusion 216; forming S124 an isolation layer 220 such that the isolation layer 220 covers at least partially the protrusion 216; and forming S126 a first semiconductor portion 231 and a second semiconductor portion 232 such that the protrusion 216 is between the first semiconductor portion 231 and the second semiconductor portion 232.

The non-planar substrate 214 may be obtained from the (planar) substrate 210 by forming (e.g. by etching the substrate or deposition of the protrusion) a protrusion on the substrate 210 and/or recesses in the substrate 210.

Using a substrate 214 with a protrusion 216 may allow the incorporation of additional (buried) semiconductor components in the protrusion 216. A protrusion 216 may be related to any non-planar structure which extends above a main surface of the substrate 214. The protrusion may have any geometry (e.g. rectangular, arch- or dome-shaped).

Figure 2:
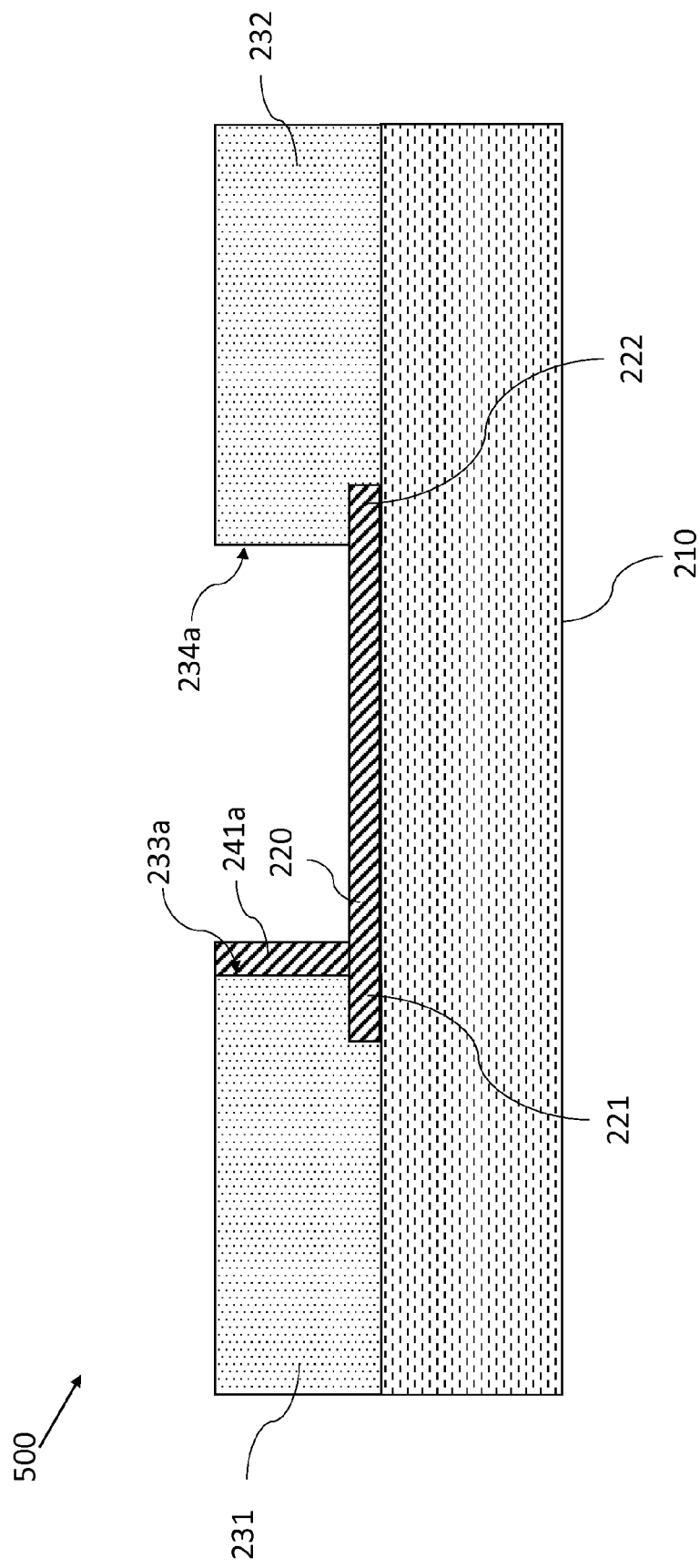
FIG. 2 depicts a semiconductor device, according to another embodiment.

FIG. 2 depicts a semiconductor device 500 according to an example of the present disclosure. The semiconductor device 500 includes: an intermediate structure; a first semiconductor portion 231 with a side surface 233a; a second semiconductor portion 232, wherein the first semiconductor portion 231 and the second semiconductor portion 232 are spaced from each other and the intermediate structure is interposed between the side surface 233a of the first semiconductor portion 231 and a facing side surface 234a of the second semiconductor portion 232; and a first side isolation layer 241a on the side surfaces 233a of the first semiconductor portion 231. The first semiconductor portion 231 laterally overlaps a first intermediate isolation layer 221 and the second semiconductor portion 232 laterally overlaps a second intermediate isolation layer 222.

The first side isolation layer 241a and the first intermediate isolation layer 221 may form an L-shape which may or may not have a rectangular angle between side isolation layer 241a and the intermediate isolation layer 221. The first intermediate isolation layer 221 may extend to any distance from the side surface of the first semiconductor portion 231 (or the side isolation layer 241a) between the first semiconductor portion 231 and the substrate 210 (e.g. up the 10% or 30% of the lateral extension of the first semiconductor portion 231). Likewise, the second intermediate isolation layers 222 may extend to any distance from the side surface of the second semiconductor portion 232 (or the side isolation layer 241a) between the first semiconductor portion 231 and the substrate 210 (e.g. up the 10% or 30% of the lateral extension of the second semiconductor portion 232). The L-shaped isolations may act as a vertical and backside isolation and may improve the isolation of the first semiconductor portions 231 or of devices formed therein, for example, by preventing surface leakage currents on the backside.

FIGS. 3A to 3F illustrate an example for manufacturing a semiconductor device according to the present disclosure.

Figure 3A:
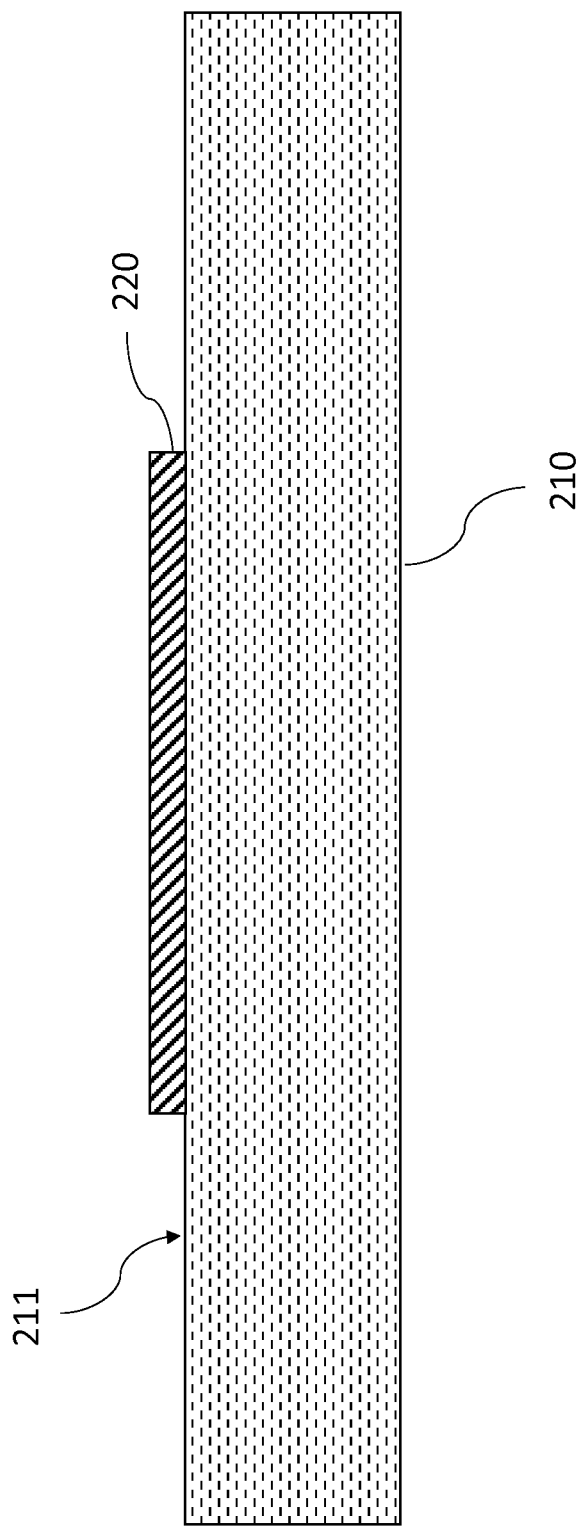
FIGS. 3A to 3F depict various stages in the manufacturing process of a semiconductor device, according to another embodiment.

Referring to FIG. 3A, a substrate 210 is depicted which includes a surface 211 and an isolating layer 220 is arranged on the surface 211. The substrate 210 may, for example, comprise a low-cost substrate material as for example a boron-doped silicon material. The isolating layer 220 may, for example, be or comprise a hard mask for a logic area. The formation of the hard mask may involve a grow process and may result in a thickness of the hard mask of, for example, 100 nm (or within the range of 10 to 500 nm). The surface 211 may be the top surface of the substrate 210, wherein the top direction may be defined as the direction along which subsequent layers are formed during the manufacturing depicted in the FIGS. 3A to 3F.

In the example of FIG. 3A, the isolating layer 220 does not cover the complete surface 211, but leaves one or more regions exposed which can be used in subsequent steps for growing semiconductor material on the underlying substrate 210. The isolating layer 220 may for example comprise silicon oxide and can be formed by a thermal oxidation process. However, also other materials are possible as, for example, carbon or other isolating materials.

Figure 3B:
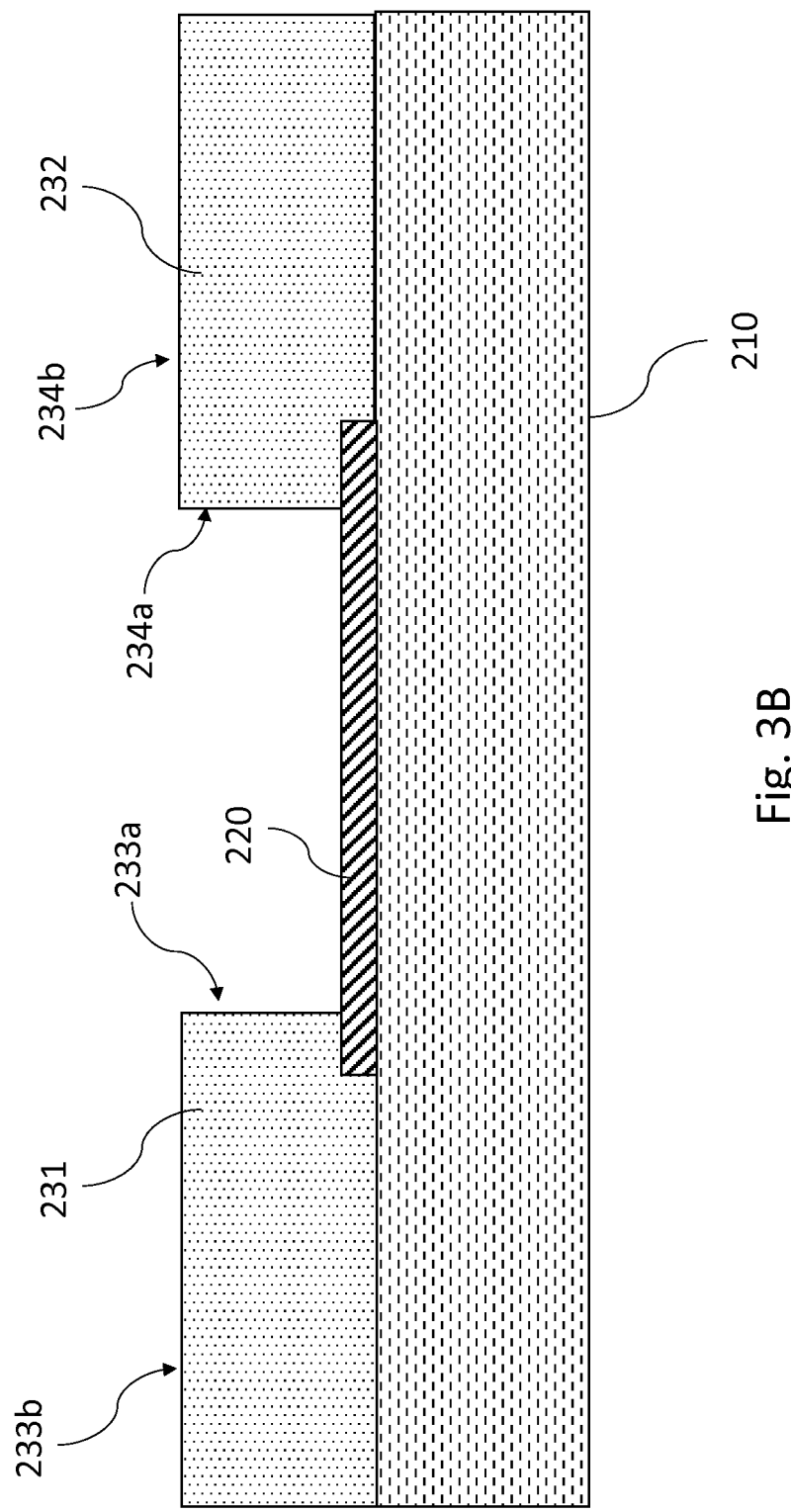

Referring now to FIG. 3B, the substrate 210 together with the isolating layer 220 as shown in FIG. 3A are used as basis to form two semiconductor portions 231, 232. In particular, a first semiconductor portion 231 is formed on a first exposed portion of the substrate 210 (i.e. on the exposed surface 211) and a second semiconductor portion 232 is formed on a second exposed portion of the substrate 210, which may be opposite to the first portion of the substrate 210 so that the isolating layer 220 may be sandwiched by or between the first semiconductor 231 and the second semiconductor portion 232.

Optionally, the first semiconductor portion 231 can partly overlay/overlap the isolating layer 220. Similarly, the semiconductor portion 232 may optionally overlay/overlap partially the isolating layer 220. For example, the first semiconductor portion 231 comprises a side surface 233a and a top surface 233b, wherein the top surface 233b is oppositely located to the substrate 210 and the side surface 233a connects the top surface 233b with a lower surface being arranged directly or indirectly on the substrate 210. Similarly, the second semiconductor portion 232 may comprise a top surface 234b and a side surface 234a such that the second top surface 234b is arranged oppositely to the substrate 210 and the second side surface 234a connects the second top surface 234b with a surface of the second semiconductor portion 232 being in contact with the substrate 210. The side surfaces 233a, 234a may be defined as those surfaces of the first and second semiconductor portions 231, 232 that face each other.

Hence, according to yet another example, in the method 110 the isolating layer 220 may comprise the first intermediate portion 221 and the second intermediate portion 222, and the first semiconductor portion 231 (or part thereof) is formed to overlap the first intermediate portion 221 and/or the second semiconductor portion 232 (or part thereof) is formed to overlap the second intermediate portion 221 with their facing side surfaces 233a, 234a.

The first semiconductor portion 231 and/or the second semiconductor portion 232 may be formed by a selective growing of semiconductor material on the substrate 210 and may provide a substrate for DMOS structures. Moreover, the first semiconductor portion 231 and/or the second semiconductor portion 232 may comprise a layer structure (or may comprise other structures), wherein different layers are formed with differently-doped regions. For example a highly-doped layer may be formed on a low-doped layer or vice-versa, wherein the doping may relate either to a p-type doping or an n-type doping to provide one or more current paths.

Therefore, in further examples the forming S116 of the first semiconductor portion 231 and spaced therefrom the second semiconductor portion 232 on the surface 211 of the substrate 210 may comprise epitaxial growth of the first semiconductor portion 231 and the second semiconductor portion 232.

The first semiconductor portion 231 and the second semiconductor portion 232 may be formed by an epitaxial growth process and may comprise a thickness between 100 nm and 20 μm (or between 20 nm and 100 μm) as measured perpendicular to a lateral extension of the substrate 210.

Figure 3C:
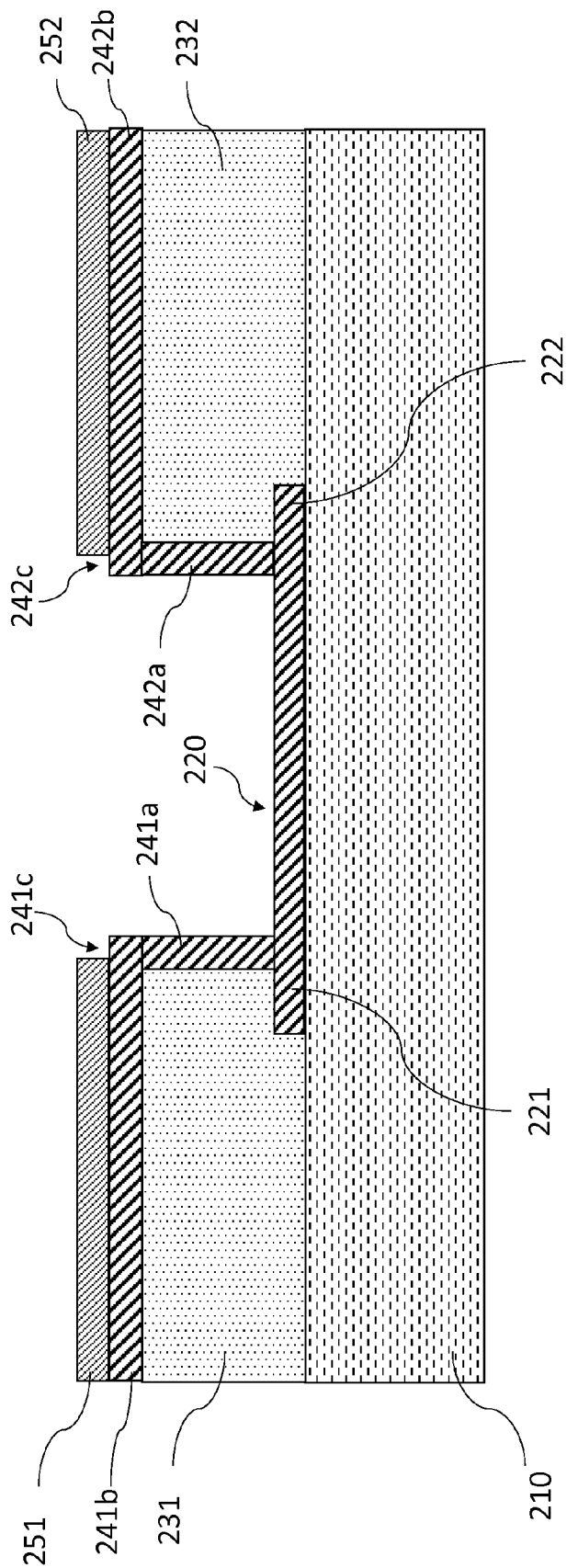

Referring now to FIG. 3C, a first side isolating layer 241a may be formed on the side surface 233a of the first semiconductor portion 231 (as depicted in FIG. 3B). Moreover, a first top isolation layer 241b may be formed on the top surface 233b of the first semiconductor portion 231. Moreover, a second side isolating layer 242a may be formed on the side surface 234a of the second semiconductor portion 232. Moreover, a second top isolating layer 242b may be formed on the top surface 234b of the second semiconductor portion 232.

The first top isolating layer 241b, the first side isolating layer 241a, the second top isolating layer 242b and/or the second side isolating layer 242a may be formed by an oxidation step (e.g., thermal oxidation) and may comprise silicon oxide, e.g., being formed from an optional silicon material of the first semiconductor portion 231 and/or the second semiconductor portion 232. In other examples, the isolation material may differ and may, e.g., comprise a nitride. The first side isolation layers 241a may be formed to provide close contact to the isolation layer 220 and/or a close contact to the first top isolation layers 241b to improve the isolation between the first and second semiconductor portions 231, 232. Similarly, the second side isolation layers 242b may be formed to provide close contact to the isolation layer 220 and/or a close contact to the second top isolation layers 242b to improve the isolation between the first and second semiconductor portions 231, 232.

Hence, according to yet another example, the method 110 may further comprise forming a first top isolation layer 241b on a surface of the first semiconductor portion 231 opposite to the substrate 210 and/or forming a second top isolation layer 242b on a surface of the second semiconductor portion 232 opposite to the substrate 210.

In addition, according to yet another example, in the semiconductor device 500 (see also FIG. 2) the isolating layer 220 may comprise the first intermediate portion 221 and the second intermediate portion 222. The first semiconductor portion 231 overlaps the first intermediate portion 221 and the second semiconductor portion 232 overlaps the second intermediate portion 221 with their facing side surfaces 233a, 234a. The semiconductor device 500 may further comprise a second side isolating layer 242a formed on the facing side surface 234a of the second semiconductor portion 232. The first side isolating layer 241a and the first intermediate portion 221 may comprise a first L-shaped isolation, and the second side isolating layer 242a and the second intermediate portion 222 may comprise a second L-shaped isolation.

Furthermore, a first masking layer 251 may be formed on top of the first isolating layer 241b. Furthermore, a second masking layer 252 may be formed on top of the second top isolating 242b. The first masking layer 251 may be formed to cover the whole top isolating layer 241b or may be formed to cover only part of the first top isolating layer 241b, thereby leaving a first portion 241c of the first top isolating layer 241b exposed to the top direction. Similarly, the second masking layer 252 may either be formed to cover the complete top surface of the second top isolating layer 242b or may cover only part of the top isolating layer 242b, thereby leaving a second portion 242c exposed. The first and second masking layers 251, 252 may be formed to protect the first and second semiconductor portions 231, 232 in subsequent acts of removing/etching of isolating layers.

Therefore, according to yet another example, the method 110 may further comprise forming a first masking layer 251 on the first top isolation layer 241b opposite to the substrate 210 and/or forming a second masking layer 252 on the second top isolation layer 242b opposite to the substrate 210, wherein the first masking layer 251 may be formed on part of first top isolation layer 241b so that a first portion 241c of the first top isolation layer 241b remains exposed. The second masking layer 252 may be formed on part of the second top isolation layer 242b so that a second portion 242c of the second top isolation layer 242b remains exposed. In other examples, the first and/or second masking layers 251, 252 may be formed to cover completely the surface of the first and/or second top isolation layer 241b, 242b.

Again, the top direction may refer to a direction starting from the substrate 210 towards the first and second masking layer 251, 252 defining the direction into which the semiconductor device is formed.

According to yet another example, in the method 110 the act of forming the first top isolation layer 241b and/or the second top isolation layer 242b and/or the act of forming the first side isolation layer 241a and/or the second side isolation layer 242a are performed by an oxidation process oxidizing exposed surfaces of the first semiconductor portion 231 and/or the second semiconductor portion 232.

The first top isolating layer 241b and/or the first side isolating layer 241a and/or the second top isolating layer 242b and/or the second side isolating layer 242a may be formed with a thickness of about 400 nm (or between 100 nm and 800 nm) and the first exposed portion 241c of the first top isolation layer 241b may comprise a width of being about half the thickness of the first top and the first side isolation layer 241a. Similarly, the width of the exposed second portion 242c may comprise again half of the thickness of the second top/side isolating layer 242a, b (as for example about 200 nm or between 50 nm and 400 nm). This processing may protect the first and second semiconductor portions 231, 232 in subsequent acts of removing of the first and second top isolation layers 241b, 242b.

Figure 3D:
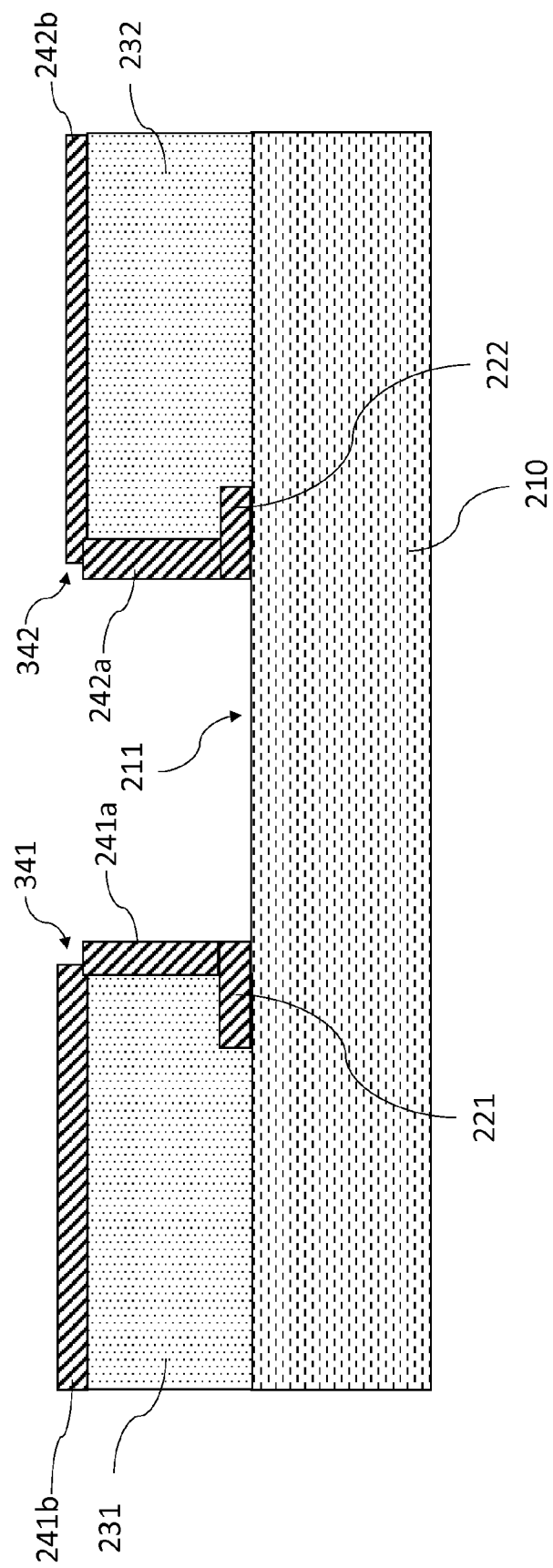

Referring now to FIG. 3D, a bottom portion of the isolating layer 220 may be removed from the substrate 210. The removed bottom portion is the portion that, in the processing stage depicted in FIG. 3C, is exposed between the first semiconductor portion 231 and the second semiconductor portion 232, but not sandwiched between the first semiconductor portion 231 and the substrate 200 or between the second semiconductor portion 232 and the substrate 200.

This removal of this portion of the isolating layer 220 can be performed by a spacer etching step. As a consequence of this removal step, a first recess portion 341 may be formed within the first top isolating layer 241b and/or a second recess 342 may be formed in the second top isolating layer 242b. These two recess portions 341, 342 correspond to the exposed first portion 241c and the exposed second portion 242c as depicted in FIG. 3C. This selection of dimensions of the exposed first and/or second portion 241c, 242c may ensure the recesses do not expose part of the first and/or second semiconductor portions 231, 232. Moreover, the first masking layer 251 and/or the second masking layer 252 as shown in FIG. 3C may be removed, thereby obtaining the structure as depicted in FIG. 3D.

According to yet another example, the method 110 may further comprise forming a first recess 341 at the first portion 241c in the first top isolation layer 241b and/or forming a second recess 342 at the second portion 242c in the second top isolation layer 242b.

The resulting structure may comprise "L"-shaped isolations (e.g., oxide). A first L-shaped isolation is arranged on the first side surfaces 233a of the first semiconductor portions 231 and the first intermediate portion 221 formed by a part of the original isolation layer 220 that is sandwiched between the first semiconductor portion 231 and the substrate 210. A second L-shaped isolation may be arranged on the second side surfaces 234a of the second semiconductor portions 231 and a second intermediate portion 222 formed by a part of the isolation layer 220 that is sandwiched between the second semiconductor portion 232 and the substrate 210.

Therefore, according to yet another example, the method 110 may further comprise removing an exposed portion of the isolating layer 220 so that the first intermediate portion 221 and the first side portion 241a may form a first L-shaped isolation, and the second intermediate portion 222 and the second side portion 241a may form a second L-shaped isolation. The first and second L-shaped isolation may provide an improved electric isolation between the first semiconductor portion 231 and the second semiconductor portion 232.

The L-shaped isolations may act as a vertical and backside isolation and improve the isolation of the first and second semiconductor portions 231, 232 or of devices formed therein. In further examples, the first intermediate portion 221 and/or the second intermediate portion 222 are absent so that merely the first side isolating layer 241a and/or the second side isolating layer 242a are formed on facing surfaces of the first semiconductor portion 231 and the second semiconductor portion 232.

In further examples, the width up to which the first intermediate portion 221 and/or the width of the second intermediate portion 222 extend between the first and second semiconductor portions 231, 232 and the substrate 210 may be selected in dependence on a backside lithographic process being performed when removing, for example, part of the substrate 210.

Figure 3E:
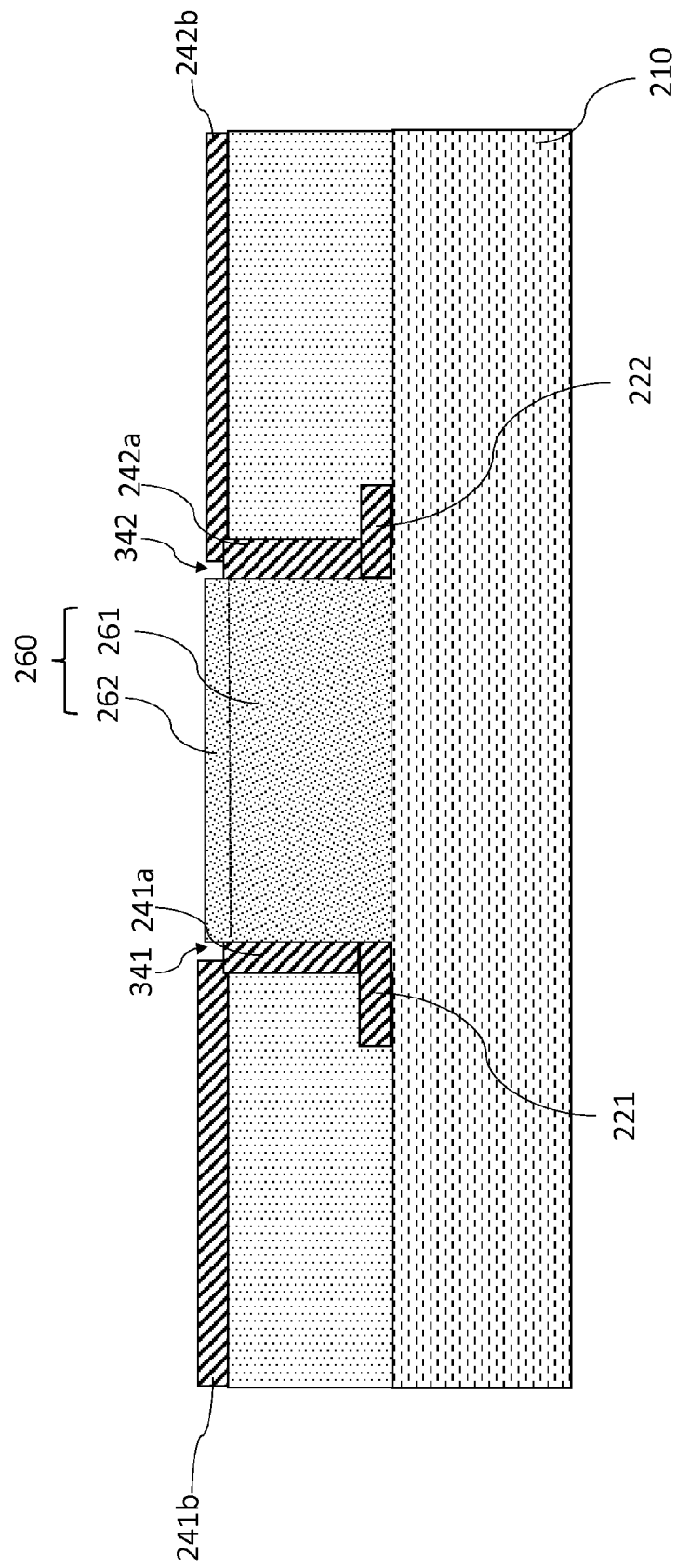

Referring now to FIG. 3E, a third semiconductor portion 260 may be formed between the first side isolating layer 241a and the second side isolating layer 242a as depicted in FIG. 3D. For example, the third semiconductor portion 260 may be formed by an epitaxial growth of semiconductor material comprising, e.g., an n- or p-type semiconductor or a combination of both. Optionally, a planarization process is performed such that the top surface of the third semiconductor portion 260 is aligned with respect to the top surfaces of the first top isolating layer 241b and with respect to the second top surface of the second top isolating layer 242b (again the top direction refers to the processing direction).

The third semiconductor portion 260 may comprise a first part 261 and a second part 262, wherein the first part 261 is arranged between the second part 262 and the substrate 210 and may comprise a thickness which is approximately the same thickness as the first semiconductor portion 231 and/or the second semiconductor portion 232. The second part 262 is formed on top of the first part 261. Both parts may comprise a different doping level or may be used later on for forming different devices inside the third semiconductor portion 260. The second part 262 may also be absent in which case the third semiconductor portion 260 extends at most up to a height of the first semiconductor portion 231 and/or the second semiconductor portion 232 (or only ½ or ⅓ or ⅔ thereof).

Moreover, the first recess 341 may optionally remain as recess in the top surface portion between the second part 262 and the first top isolating layer 241b. Optionally, the second recess 342 may remain at the interface along the top surface of the second part 262 and the second top isolating layer 242b. The depth of the first recess 341 and/or the depth of the second recess 342 may be half of the thickness of the first top isolating layer 241b and the thickness of the second top isolating layer 242b (or within a region of +/−50% thereof).

The optional planarization process may stop on the first top isolating layer 241b and/or the second top isolating layer 242b, thereby achieving a planar top surface of the whole semiconductor device as depicted in FIG. 3E. The optional planarization step may comprise a CMP process (CMP=Chemical Mechanical Polishing). Optionally, the first and second top isolating layer 241b, 242b may be used as oxide "stamps" in predetermined distances from each other.

There are further options. For example, in case of a thick substrate epitaxy, it may be beneficial to keep the epitaxial time short. A possibly increased stress can be tolerated for some applications. The thicknesses of the first semiconductor portion and/or the second semiconductor portion 231, 232 and/or the third semiconductor portion 260 may be between 1 and 5 µm or between 0.2 µm and 20 µm.

Optionally, the insulating layer 220 may be kept throughout the hole gap between the first and second semiconductor portion 231, 232 so that the third semiconductor portion 260 portion is electrically insulated from the first and second semiconductor portion 231, 232 and/or a backside contact. For example, the third semiconductor portion (260) may be arranged between the first side isolating layer 241a and the second side isolating layer 242a and a back side contact may be arranged at a backside of the semiconductor substrate structure of the semiconductor device. The semiconductor substrate structure may includes at least the first semiconductor portion 231. Additionally, the semiconductor substrate structure may comprise the second semiconductor portion and/or a semiconductor substrate 210 used for growing the first and/or second semiconductor portion. Further, the third semiconductor portion 260 may be electrically insulated from the backside contact. The backside contact may be a drain contact or a collector contact of a transistor structure formed within the first and/or second semiconductor portion, for example.

Figure 3F:
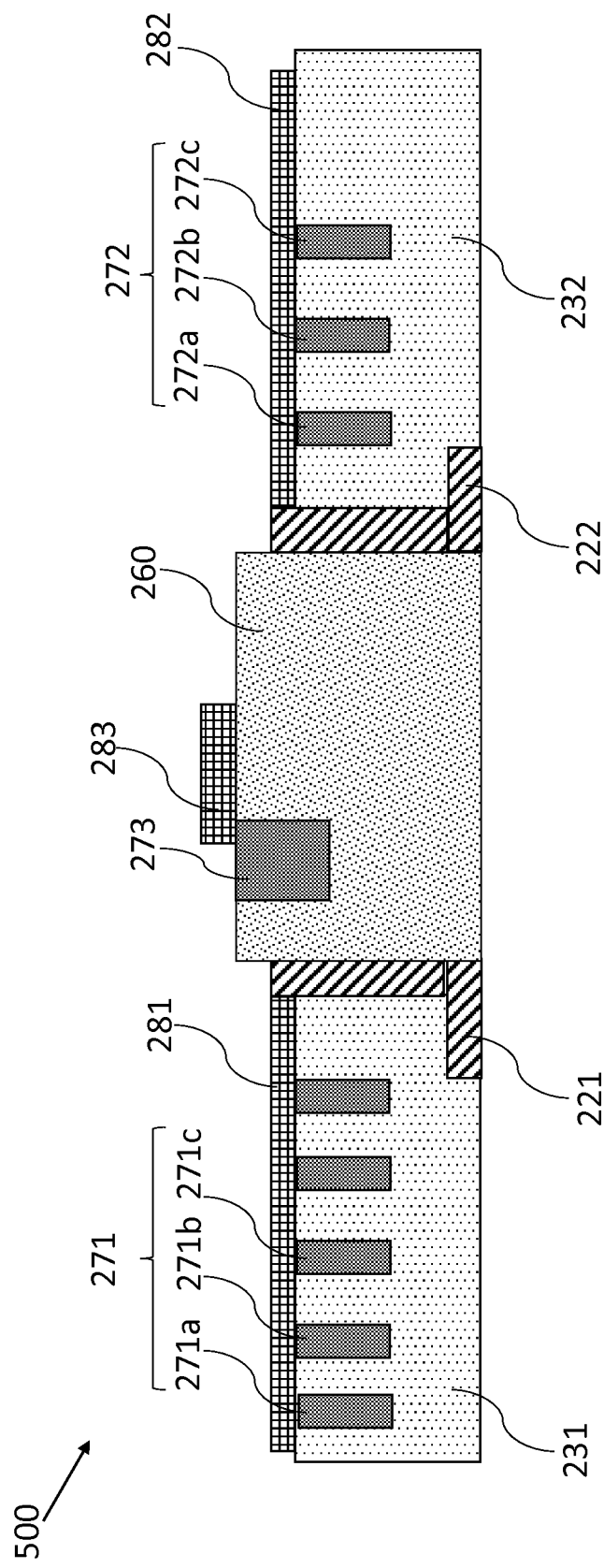

Referring now to FIG. 3F, the substrate 210 may be partly or completely thinned in a subsequent process, thereby exposing surfaces opposite to the top surface of the first semiconductor portion 231 and the second semiconductor portion 232 and/or of the third semiconductor portion 260 as depicted in FIG. 3F.

Therefore, according to yet another example, the method 110 may further comprise removing the first top isolation layer 241b and/or the second top isolation layer 242b and/or removing the first masking layer 251 and/or second masking layer 252.

Furthermore, a first plurality of semiconductor devices 271, 281 can be formed within the first semiconductor portion 231 and/or a second plurality of semiconductor devices 272, 282 may be formed within the second semiconductor portion 232. For example, the first plurality of semiconductor devices may comprise a first plurality of trenches 271 and a first contacting structure 281 formed on the top surface of the first semiconductor portion 231. The plurality of trenches 271 may comprise a first trench 271a, a second trench 271b, a third trench 271c and so on, thereby enabling the formation of, for example, one or more trench MOSs within or representing a first DMOS area. The second plurality of semiconductor devices may comprise a second plurality of trenches 272 comprising, for example, a first trench 272a, a second trench 272b and a third trench 272c. Moreover, the second plurality of semiconductor devices may comprise a second contacting structure 282 formed on the top surface of the second semiconductor portion 232. Again, the second plurality of trenches 272 and the respective contacting structure 282 form a further DMOS area with one or more trench transistors in the second semiconductor portion 232.

Moreover, within the third semiconductor portion 260, a first embedded device 273 may be formed and/or a third contacting structure 283 may be formed for connecting the embedded device 273 or other devices not shown in FIG. 3F.

In further examples, other or additional devices (e.g. PMOS, diodes, resistors, inductances, etc.) are formed in the first, second and/or third semiconductor portions 231, 232, 260. For example, FIG. 3F is only a cross-sectional view through one particular type of devices and in the direction perpendicular to the drawing plane other components may be formed. Furthermore, also bipolar sense structures (e.g., for temperature and currents) may be formed inside the third semiconductor portion 260, but also within the first and second semiconductor portions 231, 232.

The thinning or removal of the substrate 210 may, for example, involve an etching step which stops, for example, on the first intermediate portion 221 and the second intermediate portion 222 (which may be formed as oxides). In further examples it is also possible that the substrate is not completely removed from the backside, but is only thinned. This thinned substrate under the first semiconductor portion 231 and the second semiconductor portion 232 still provides support and/or may be used for supplying connections between various components.

On the other hand, it may be advantageous to remove the substrate completely, thereby increasing the isolation property between the first semiconductor devices 271, 281 and the second plurality of semiconductor devices 272, 282. For example, by removing the substrate from the backside, the drain signals may be completely (dielectrically) decoupled so that any cross-talk can be prevented, thereby improving the isolation between the, for example, highly-doped silicon areas.

Figure 4:
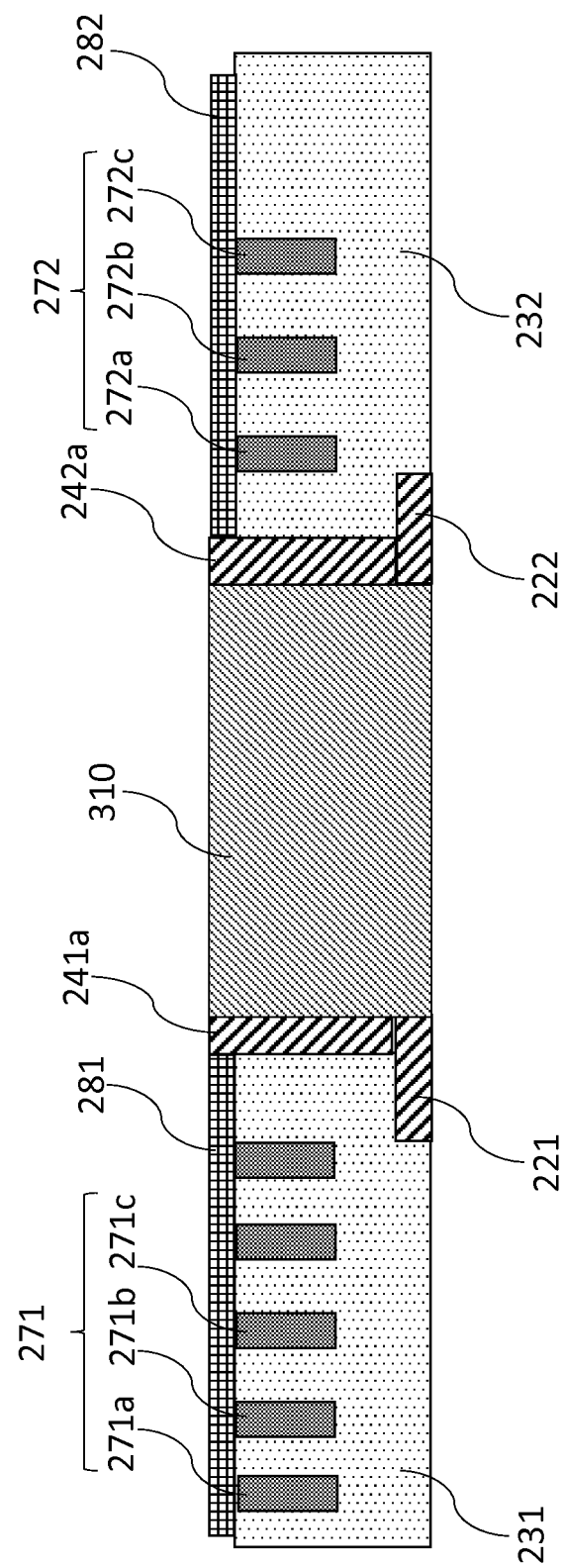
FIG. 4 depicts a semiconductor device, according to another embodiment.

Referring now to FIG. 4, in further examples, instead of forming the third semiconductor portion 260 between the first and second semiconductor portions 231, 232 (as shown in FIG. 3E), an isolating portion 310 is optionally formed between the first side isolating layer 241a and the second side isolating layer 242a. This isolating portion 310 may further increase the isolation between both DMOS areas 231, 232. For example, the components 271, 281 formed inside the first semiconductor portion 231 are in this example highly insulated from the semiconductor components 272, 282 formed in the second semiconductor portion 232. Again, the first intermediate portion 221 and/or the second intermediate portion 222 provide a further improvement with respect to the isolation property, for example, by preventing surface leakage currents on the backside.

Therefore, according to yet another example, in the semiconductor device 500 (see FIG. 2) the isolating layer may further comprise: a third semiconductor portion 260 between the first side isolating layer 241a and the second side isolating layer 242a; and at least one of the following components in the first semiconductor portion 231 and/or in the second semiconductor portion 232 and/or in the third semiconductor portion 260: a plurality of differently doped layers; a plurality of trenches 271, 272; a contacting structure 281, 282, 283; and an embedded device (273).

The isolating portion 310 may, for example, comprise again an oxide, nitride or an oxide together with poly silicon or other isolating materials.

Figure 5:
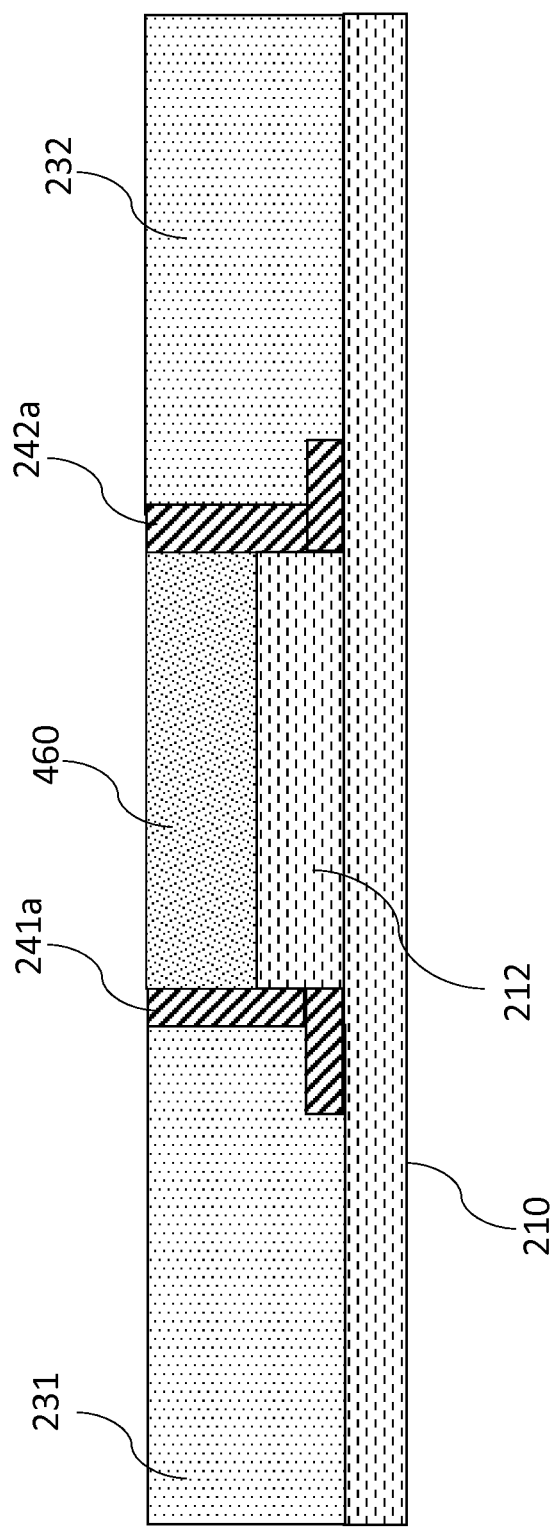
FIG. 5 depicts a further semiconductor device, according to another embodiment.

Referring now to FIG. 5, in this example, the substrate 210 is only thinned from the backside, thereby still allowing the possibility that portions of the substrate 210 can connect different semiconductor portions and/or improve the support. Moreover, between the first side isolating layer 241a and the second side isolating layer 242a a further substrate portion 212 can be formed or may be present. For example, the further substrate portion 212 may be formed in a subsequent step following the stage of manufacturing as depicted in FIG. 3D. On the other hand, it may also be possible to start with a substrate having a protrusion 212 and forming the isolating layer 220 to cover the protrusion, which may subsequently be removed from the top surface of the protrusion, thereby obtaining the structure as depicted in FIG. 5.

Figure 6:
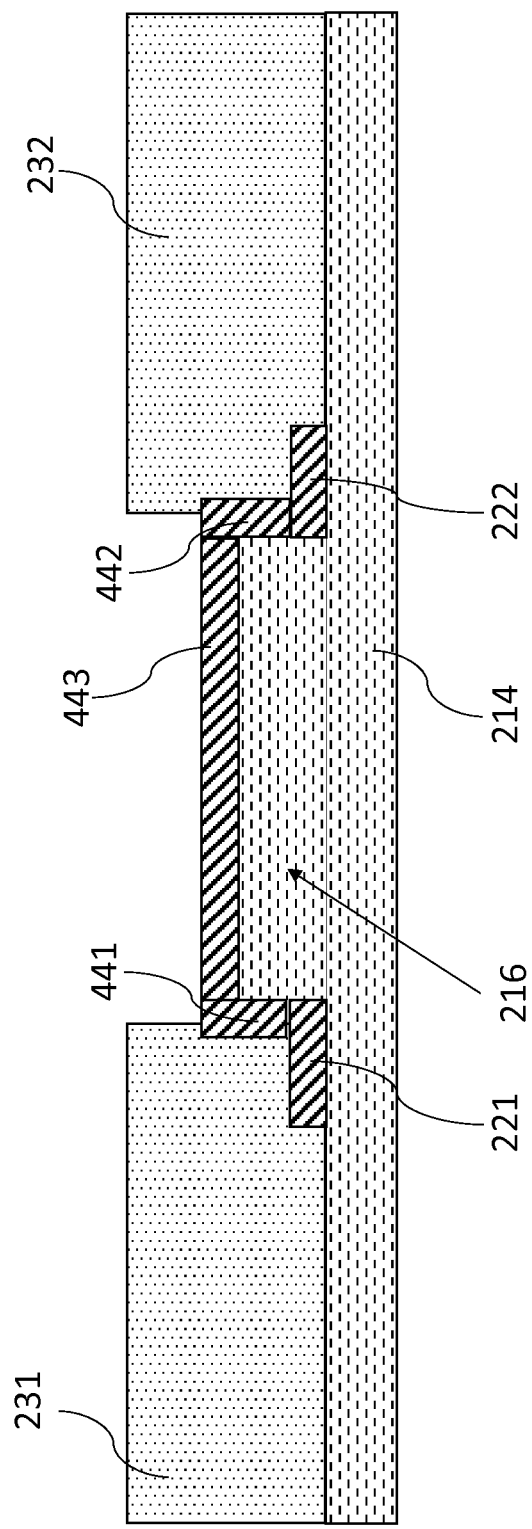
FIG. 6 depicts a further semiconductor device, according to another embodiment.

In FIG. 5, an L-shaped isolation structure is indicated. Alternatively, the first and second semiconductor portions 231, 232 may be grown with a lateral overlap to an insulation layer covering the protrusion during growing the first and second semiconductor portions 231, 232 (e.g., a small overlap is shown in FIG. 6). Similar to the intermediate isolation layers between the first and second semiconductor portions 231, 232 and the non-planar substrate 214 neighboring the protrusion, further lateral parts of an intermediate isolation layer (e.g. part of the insulation layer covering the substrate during growth if the first and second semiconductor portion) may be obtained between the first and second semiconductor portion 231, 232 and the protrusion, since the insulation layer may be removed only at a part not covered by the first and second semiconductor portions. Afterwards, the first side isolating layer 241a and the second side isolating layer 242a may be formed. The first side isolating layer 241a and the second side isolating layer 242a may join the further lateral parts of the intermediate isolation layer. The resulting insulation structure may comprise a stepped cross section with a horizontal part between the first and/or second semiconductor portions 231, 232 and the non-planar substrate 214 neighboring the protrusion, a vertical part between the first and/or second semiconductor portions 231, 232 and the side wall of the protrusion, a horizontal part between first and/or second semiconductor portions 231, 232 and the lateral surface of the protrusion and a vertical part between the first and/or second semiconductor portions 231, 232 and a fourth semiconductor portion 460 arranged between the first side isolating layer 241a and the second side isolating layer 242a.

Therefore, according to yet another example, the method 110 may further comprise forming one of the following structures between the first and second semiconductor portions 231, 232: (a) forming a protrusion 212 of the substrate 210; and (b) forming a protrusion 212 of the substrate 210 and/or a third top isolating layer 443 on the protrusion 212.

Optionally, on the exposed surface of the substrate portion 212, a fourth semiconductor portion 460 can be formed.

Therefore, the fourth semiconductor portion 460 may be formed between the first side isolating layer 241a and the second side isolating layer 242a and a top surface of the further substrate portion 212. Again, in the structure as depicted in FIG. 5, the pluralities of semiconductor components as described in conjunction with FIGS. 3F and 4 can again be formed inside the first semiconductor portion 231 and/or the second semiconductor portion 232 and/or inside the fourth semiconductor portion 460. Therefore, the respective description provided in conjunction with FIGS. 3F and 4 does also apply for the example shown in FIG. 5. The fourth semiconductor portion 460 may be of the same type as the third semiconductor portion 260 with the only difference that the fourth semiconductor portion is formed on the protrusion 216 or the substrate portion 212.

The structure as depicted in FIG. 5 allows the possibility to have buried DMOS structures after a p-etching process (e.g. to thin the substrate which might be of p-type). The thinned substrate 210 as depicted in FIG. 5 with the further substrate portion/protrusion 212 may be used as a support for the first and second semiconductor portions 231, 232 or, may also be used as an embedding structure for a plurality of semiconductor portions, not only two as depicted in FIG. 5.

In a further example, instead of thinning the whole substrate 210, it may also be possible to thin only those portions, where the semiconductor portions 231, 232 are to be embedded thus arriving at the substrate 210, 212 as depicted in FIG. 5. Therefore, an etching process may start with the substrate 210 depicted in FIG. 3A and the etched portions correspond to the portions where the first and second semiconductor portions 231 and 232 are formed in a subsequent step as depicted in FIG. 3B. Therefore, the example as shown in FIG. 5 may be obtained by the same series of steps as shown in FIGS. 3A to 3F. However, before the isolating layer 220 is formed on the top surface 211, recesses inside the substrate 210 may be formed. These recesses are used to form the first and second semiconductor portions 231, 232 as depicted in FIG. 5. The substrate 210, 211 may again comprise any isolating material or a high-resistive material.

Optionally, the fourth semiconductor portion 460 may also be replaced by another isolating portion or any other material.

Referring now to FIG. 6, the structure may not comprise a planar substrate 210. This structure may be obtained by same processing steps as described before. For example, the manufacturing may start with providing a non-planar substrate 214 comprising at least one protrusion 216. The at least one protrusion 216 may be formed by starting with a planar substrate and performing an etching step (see description of FIG. 5), thereby providing recesses inside the substrate while leaving mesa portions or protrusions in the substrate 214. The at least one protrusion 160 defines an interposing structure between the subsequently-formed semiconductor portions 231, 232 inside the recesses of the substrate 214.

After having the non-planar substrate 214 with at least one protrusion 216, the steps as depicted with FIGS. 3A to 3F can be repeated, meaning that an isolating layer 220 is formed to cover the at least one protrusion 216. As a result, an isolating layer is formed which may comprise a third top isolating portion 443 being formed on top of the protrusion 216, a first intermediate portion 221 formed between the first semiconductor portion 231 and the thinned substrate 214, and a second intermediate portion 222 formed between the second semiconductor portion 232 and the thinned substrate 214. In addition, a first side isolating portion 441 is formed to connect the third top isolating portion 443 and the first intermediate portion 221. Moreover, a second side isolating portion 442 is formed to connect the third top isolating portion 443 and the second intermediate portion 222.

In further optional processes, the top isolating portion 443 may be removed as described in connection with FIG. 3D. Optionally, on top of the protrusion 216 (or optionally on top of the third isolating portion 443), another semiconductor portion can be formed as described in connection with FIG. 3E. In further examples, further semiconductor devices can be arranged within the further portion formed on top of the protrusion 216.

In the example as depicted in FIG. 6, it may be of advantage to have an overlap between the first semiconductor portion 231 and the first side isolating portion 441. It may be further advantageous to have a further overlap of the second semiconductor portion 232 and the second side isolating portion 442 to improve the isolation or support.

Therefore, further examples relate to a first semiconductor portion 231 and a second semiconductor portion 232 which are formed on a thinned substrate and separated from each other by a protrusion 216 which is covered by a third isolating portion 221, 441, 443, 442, 222, while optionally allowing that the first and/or second semiconductor portions 231, 232 extend up to a predetermined distance on or towards a top surface of the third isolating layer (i.e. the third top isolating portion 443).

Therefore, according to yet another example, in the further method 120 the layer 220 comprises: a first side isolating portion 441, the second side isolating portion 442 and a top isolating portion 443, wherein the protrusion 216 is arranged between the first side isolating portion 441 and the second side isolating portion 442, and the top isolating portion 443 connects the first side isolating portion 441 and the second side isolating portion 442, the method further comprising removing the top isolating portion 443.

According to yet another example, the further method 120 may further comprise: forming a first isolating layer 241a and the second side isolating layer 242a at facing side surfaces of the first semiconductor portion 232 and the second semiconductor portion 232.

According to yet another example, the further method 120 may further comprise: forming, in a region between the first side isolation layer 241a and the second side isolation layer 242a, an isolating portion 310 and/or a third semiconductor portion 260, 460.

Therefore, according to yet another example, the method 110 or the further method 120 may further comprise at least partly thinning the substrate 210.

According to yet another example, the method 110 or the further method 120 may further comprise: forming a first type of semiconductor element in the first semiconductor portion 231 and/or in the second semiconductor portion 232 and forming a second type of semiconductor element in the third semiconductor portion 260, 460, wherein the first type of semiconductor element comprises a higher blocking voltage than the second type of semiconductor element. The first type of semiconductor element may comprise, e.g., a DMOS structure, an IGBT (insulated gate bipolar transistor), power devices, etc. The second type of semiconductor element may comprise, e.g., CMOS structure, low voltage devices. etc. The second type of semiconductor element may comprise a blocking voltage below 10V (or below 5V) and the first type of semiconductor element may comprise a blocking voltage above 20V (or above 50V, above 100V or above 500V).

Furthermore, the first semiconductor portion 231 and/or in the second semiconductor portion 232 and/or in the third semiconductor portion 260, 460 may comprise at least one of the following components: a plurality of differently doped layers; a plurality of trenches 271, 272; a contacting structure 281, 282, 283; and an embedded device 273.

According to yet another example, the method 110 or the further method 120 may further comprise removing of at least part of the substrate 210 from the first semiconductor portion 231 and/or the second semiconductor portion 232 and/or the third semiconductor portion 260.

Some embodiments relate to an isolation scheme suitable for highly-doped silicon.

Drivers and FETs may be realized separately, while current sense and temperature sense may be integrated in MOSFET technology. In comparison, a device according the proposed concept may be improved for example with respect to voltage peaks or the requirements for avalanche robustness of the sense structures. Moreover, temperature sense may be formed by using poly diodes or more complex structures as well. The integration of the driver output stage allows for decreasing driver losses while achieving a small gate inductivity, for example. In addition, the proposed concept may satisfy a need for integration small logic units in a cost-efficient way, thereby saving costs for the packaging processing.

For example, the present disclosure provides a method for manufacturing a semiconductor device which enables such integration of additional devices in, for example, highly-specialized DMOS (double-diffused metal-oxide-semiconductor) architecture which maintains the performance of the DMOS devices. Performance parameter are, for example, Rdson (turn on resistance) and Qg (gate charge characteristics). The present disclosure uses, for example, the possibilities of modern silicon epitaxial technology and thin wafer processing.

Examples of the present disclosure relate to the manufacturing of a semiconductor device based on a selective growth of epitaxial layers. Further examples relate a simple isolation method for separating different DMOS areas from logic areas. The term logic may refer, for example, to resistors, diodes, capacitors and lateral or vertical N/P-MOSFETs (n-type or p-type field effect transistors using metal-oxide-semiconductor technology). The isolation schemes as used in the present disclosure can ensure the integration of a variety of devices (which are called logic areas) next to optimized DMOS devices. To achieve this, optimized epitaxial material and substrate material might be used, for example.

These devices may be able to ensure a secure isolation, for example, of vertical currents from each other, which in devices which are arranged laterally within a substrate. For example, a common drain contact is often provided on the backside and if the devices are highly integrated a "crosstalk" of signals may occur. Furthermore, the devices may be very thin and may comprise a thickness of, for example, only 10 to 20 μm. In order to provide nevertheless current paths for strong currents, highly-doped silicon areas may be used within these devices. In particular, if these highly-doped silicon areas are arranged closely adjacent to each other, a reliable isolation scheme is needed.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, and the like represent various processes.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. A method for manufacturing a semiconductor device comprising:
   providing a substrate with a surface;
   forming an isolating layer on part of the surface;
   forming a first semiconductor portion and forming a second semiconductor portion spaced therefrom with a portion directly on the surface of the substrate,
   wherein the isolating layer is interposed between a side surface of the first semiconductor portion and a side surface of the second semiconductor portion, which face each other,
   wherein the isolating layer comprises a first intermediate portion that is covered by the first semiconductor portion;
   and forming a first side isolation layer on the side surface of the first semiconductor portion,
   and removing an exposed portion of the isolating layer so that the first intermediate portion and the first side portion form a first L-shaped isolation.

2. The method of claim 1, further comprising: forming a second side isolation layer on the side surface of the second semiconductor portion.

3. The method of claim 1, wherein the isolating layer further comprises a second intermediate portion and a part of the second semiconductor portion covers the second intermediate portion.

4. The method of claim 1, further comprising forming a first top isolation layer on a surface of the first semiconductor portion opposite to the substrate, and forming a second top isolation layer on a surface of the second semiconductor portion opposite to the substrate.

5. The method of claim 4, wherein the act of forming the first top isolation layer and the second top isolation layer and the act of forming the first side isolation layer and the second side isolation layer are performed by an oxidation process comprising oxidizing exposed surfaces of the first semiconductor portion and the second semiconductor portion.

6. The method of claim 4, further comprising:
   forming a first masking layer on the first top isolation layer opposite the substrate and forming a second masking layer on the second top isolation layer opposite to the substrate,
   wherein the first masking layer is formed on part of first top isolation layer so that a first portion of the first top isolation layer remains exposed, and the second masking layer is formed on part of the second top isolation layer so that a second portion of the second top isolation layer remains exposed.

7. The method of claim 6, wherein the exposed portion of the isolating layer is removed such that the second intermediate portion and the second side portion form a second L-shaped isolation.

8. The method of claim 6, further comprising: removing the first top isolation layer and the second top isolation layer or removing the first masking layer and the second masking layer.

9. The method according of claim 4, further comprising: forming at least one of the following structures between the first and second semiconductor portions: forming a protrusion of the substrate; and forming a protrusion of the substrate and a third top isolating layer on the protrusion.

10. A method for manufacturing a semiconductor device comprising: providing a substrate with a surface:
    forming an isolating layer on part of the surface;
    forming a first semiconductor portion and forming a second semiconductor portion spaced therefrom with a portion directly on the surface of the substrate, wherein the isolating layer is interposed between a side surface of the first semiconductor portion and a side surface of the second semiconductor portion, which face each other;
    and forming a first side isolation layer on the side surface of the first semiconductor portion, wherein the isolating layer comprises a first intermediate portion and a second intermediate portion and a part of the first semiconductor portion covers the first intermediate portion and a part of the second semiconductor portion covers the second intermediate portion.

* * * * *

UNITED STATES PATENT AND TRADEMARK OFFICE
CERTIFICATE OF CORRECTION

PATENT NO. : 9,583,565 B2
APPLICATION NO. : 14/731970
DATED : February 28, 2017
INVENTOR(S) : M. Poelzl Page 1 of 1

It is certified that error appears in the above-identified patent and that said Letters Patent is hereby corrected as shown below:

On the Title Page

Abstract (Lines 1&2), please change "comprises includes providing" to -- includes providing --

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*